(12) United States Patent
Terahara

(10) Patent No.: US 7,541,120 B2
(45) Date of Patent: Jun. 2, 2009

(54) MANUFACTURING METHOD OF SEMICONDUCTOR DEVICE

(75) Inventor: Masanori Terahara, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 715 days.

(21) Appl. No.: 11/066,050

(22) Filed: Feb. 28, 2005

(65) Prior Publication Data

US 2006/0093963 A1 May 4, 2006

(30) Foreign Application Priority Data

Nov. 2, 2004 (JP) ............................. 2004-319440

(51) Int. Cl.
*G03C 5/00* (2006.01)
*G03F 9/00* (2006.01)

(52) U.S. Cl. ........................... 430/22; 430/30; 430/311; 430/312; 430/328; 430/394

(58) Field of Classification Search .................. 430/22, 430/311, 312, 328, 394, 30
See application file for complete search history.

(56) References Cited

FOREIGN PATENT DOCUMENTS

| | | |
|---|---|---|
| WO | WO 96/04592 | 2/1996 |
| WO | WO00/49367 | 8/2000 |

OTHER PUBLICATIONS

Patent Abstracts of Japan, Publication No. 2002122975 A, published on Apr. 26, 2002.
Patent Abstracts of Japan, Publication No. 2001209167 A, published on Aug. 3, 2001.
Patent Abstracts of Japan, Publication No. 62174914 A, published on Jul. 31, 1987.
Patent Abstracts of Japan, Publication No. 09245709 A, published on Sep. 19, 1977.
Patent Abstracts of Japan, Publication No. 2001085317 A, published on Mar. 30, 2001.

*Primary Examiner*—Christopher G Young
(74) *Attorney, Agent, or Firm*—Westerman, Hattori, Daniels & Adrian, LLP.

(57) ABSTRACT

After forming a resist film on a Si substrate, a circuit pattern for a semiconductor integrated circuit, a first L-shaped length measuring pattern and a cross-shaped monitor pattern for alignment are formed on the resist film. Next, based on these patterns, the Si substrate is patterned. Thereafter, a polysilicon film is formed above the Si substrate. Subsequently, a resist film is formed on the polysilicon film. Next, a circuit pattern for a semiconductor integrated circuit, a second L-shaped length measuring pattern and a cross-shaped monitor pattern for alignment are formed on the resist film. At this time, the second L-shaped length measuring pattern is made to face in a direction in which the first L-shaped length measuring pattern is rotated 180 degrees in plane view. By patterning the polysilicon film with these patterns as a mask, a gate electrode is formed.

20 Claims, 18 Drawing Sheets

(d)

(e)

(f)

MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2004-319440, filed on Nov. 2, 2004, the entire contents of which are incorporated herein by reference.

BACKGROUND OF THE INVENTION

1. Field of the Invention

The present invention relates to a manufacturing method of a semiconductor device which is enhanced in accuracy of measuring length.

2. Description of the Related Art

When a semiconductor device is manufactured, various films are formed above a semiconductor substrate, and thereafter, a resist pattern is formed thereon. With the resist pattern as a mask, patterning of a film or ion-implantation is performed. Accordingly, dimensional accuracy of the resist pattern needs to be kept high.

Thus, in forming the resist pattern, a monitor pattern which is not used in forming a semiconductor integrated circuit is formed other than a circuit pattern, which is actually used in forming the semiconductor integrated circuit. In this case, arrangement and the like of the monitor pattern, which is not used in forming the semiconductor integrated circuit, is made as similar to the circuit pattern as possible so that if a variation occurs to the circuit pattern, the same variation as that also occurs to the monitor pattern. Accordingly, when a size of the monitor pattern is measured, a size, variation and the like of the circuit pattern can be grasped. The reason why the size of the circuit pattern is not measured is that shrinkage and deformation of the resist pattern occur on measurement as will be described later.

Such a monitor pattern is formed in a length measuring monitor region, which is secured in a scribe line or a chip.

For example, when a size of a resist pattern which is used in patterning a polysilicon film for forming a gate electrode is grasped, an element isolation region is formed in a region in which an integrated circuit is to be formed (not shown) by STI (shallow Trench Isolation) first, and an element isolation region 52 is also formed in a length measuring monitor region 51 outside it as shown in FIG. 8A. As a result, a plurality of active regions 53 are defined. Subsequently, as shown in FIG. 8B, after formation of a gate insulation film (not shown) and the like are performed, a polysilicon film is formed, and this is patterned by using the resist pattern, whereby polysilicon patterns 54 which are the same as gate electrodes are formed in the region where the integrated circuit is to be formed and the length measuring monitor region 51. At this time, the size of the resist pattern is measured before and after formation of the polysilicon pattern 54, whereby accuracy of the resist pattern and degree of trimming can be grasped.

When the formation is performed by repeating the same pattern as a SRAM, the element isolation region 52 is formed in the length measuring monitor region 51 and the active regions 53 are defined as shown in FIG. 9A. Thereafter, the polysilicon patterns 54 are formed as shown FIG. 9B. In this case, the dimension of the resist pattern is measured before and after formation of the polysilicon pattern 54, and thereby, accuracy of the resist pattern and degree of trimming can be grasped.

In measuring a size of a resist pattern, a scanning electron microscope which executes a program for detecting a size measuring pattern in a length measuring monitor region 51 as described above is used.

In order to steadily manage variation of line width difference of photolithography, not only an isolated pattern and, a line and space (L/S) pattern, but also a repetitive pattern which is closely analogous to the circuit pattern is sometimes formed in the length measuring monitor region 51.

However, in a conventional manufacturing method of a semiconductor device, it is difficult to detect the size measuring pattern in the length measuring monitor region 51 quickly and to measure the size. Therefore, while searching the size measuring pattern, a resist pattern is irradiated with an electron beam a lot. Therefore, when endurance of the resist pattern against the electron beam is low, shrinkage and deformation of the resist pattern occur. Especially in an ArF chemically amplified resist suitable for microfabrication in recent years, this tendency is large. As microfabrication is advanced, influence of shrinkage and deformation of the resist pattern become large, and only the deformation of about 2 to 3 nm cannot be allowed in recent years.

For example, in order to perform length measurement, focus has to be achieved after a pattern is recognized. If the ArF chemically amplified resist is used in this case, the line width of the length measuring pattern sometimes deforms and shrinks in a range of less than 10 nm when focus is achieved at a length measuring spot under high magnification. When observation is performed at the length measuring spot under low magnification, deformation or the like similarly occurs due to irradiation of an electron beam. Therefore, length measurement with high accuracy becomes difficult. At a spot where the length measurement is performed even once, deformation and shrinkage of the resist pattern has occurred, and therefore, it is difficult to obtain the degree of trimming by performing length measurement at the same spot after etching.

Related arts are disclosed in Japanese Patent No. 3333680, Japanese Patent Application Laid-open No. 2001-85317, WO 00/49367, Japanese Patent No. 2723508, Translated National Publication of Patent Application No. 1997-504142, Japanese Patent Application Laid-open No. 2002-122975, and Japanese Patent Application Laid-open No. 2001-209167.

SUMMARY OF THE INVENTION

An object of the present invention is to provide a manufacturing method of a semiconductor device capable of measuring length with high accuracy even under a condition in which shrinkage or the like of a measurement target easily occurs.

As a result of repeating the earnest study on the cause of inability of quick detection of the size measuring pattern as described above, the inventor of the present application has found out that the detection becomes difficult mainly because positional displacement of alignment occurs in the conventional manufacturing method of the semiconductor device. Such positional displacement occurs when size measurement targets are changed among the chips, for example. Namely, size measurement is not performed for one chip in a wafer, but is performed for each chip in principle. Therefore, the measurement targets needs to be changed by operating a stage of a scanning electron microscope, and in this case, positional displacement occurs. Due to such positional displacement, pattern recognition cannot be performed, and a center line of the L/S pattern cannot be detected.

For example, if an analogous pattern exists around the pattern of the target of length measurement concerning pattern recognition at the time of length measurement, length measurement of the analogous pattern is performed due to erroneous recognition. On the other hand, in order to recognize the length measurement position with a pattern with less similarity as a reference in the periphery of the target length measuring pattern, it is necessary to set the magnification of the scanning microscope at low magnification. However, with low magnification, it is difficult to detect a center line in the L/S pattern with three or more lines and spaces, and a different line from the target line is sometimes erroneously recognized and measured.

Quadrangular dummy patterns are sometimes formed in parallel with an active region and a gate electrode. Side length of the quadrangular dummy patterns is usually set within 2 μm. It is not impossible to perform detection by using these quadrangular dummy patterns as a reference point of alignment. But since the positions of the quadrangular dummy patterns change in accordance with the patterns of the integrated circuit, it is also difficult to perform detection quickly.

As a result that the inventor of the present application further repeated earnest study in consideration of the prior art as above, the inventor has found out that the above problem can be solved by adding an idea to the pattern formed in the length measuring monitor region, and has conceived the various modes of the invention as shown below.

In a first manufacturing method of a semiconductor device according to the present invention, after forming a resist film on an object to be worked, a circuit pattern for a semiconductor integrated circuit, a length measuring pattern and a monitor pattern for alignment with its plane shape constituted of polygonal shapes except for a quadrangle whose side length is within 2 μm (dummy pattern size), on the resist film. The object to be worked is patterned with the circuit pattern, length measuring pattern and monitor pattern for alignment as a mask.

In a second manufacturing method of a semiconductor device according to the present invention, after forming a first resist film on a first object to be worked, a first circuit pattern for a semiconductor integrated circuit, a first L-shaped length measuring pattern and a first monitor pattern for alignment with its plane shape constituted of polygonal shapes except for a quadrangle whose side length is within 2 μm are formed on the first resist film. Next, the first object to be worked is patterned based on the first circuit pattern, the first L-shaped length measuring pattern and the first monitor pattern for alignment. Next, a second object to be worked is formed on or above the first object to be worked. Thereafter, a second resist film is formed on the second object to be worked. Subsequently, a second circuit pattern for a semiconductor integrated circuit, a second L-shaped length measuring pattern and a second monitor pattern for alignment with its plane shape constituted of polygonal shapes except for a quadrangle whose side length is within 2 μm are formed on the second resist film so that the second L-shaped length measuring pattern faces in a direction in which the first L-shaped length measuring pattern is rotated 180 degrees in plane view. The second object to be worked is patterned with the second circuit pattern, the second L-shaped length measuring pattern and the second monitor pattern for alignment as a mask.

DETAILED DESCRIPTION OF THE PREFERRED EMBODIMENTS

Herein after, embodiments of the present invention will be concretely explained with reference to the attached drawings. A constitution of a semiconductor device will be explained with a manufacturing method of it for convenience.

First Embodiment

Figure 1:
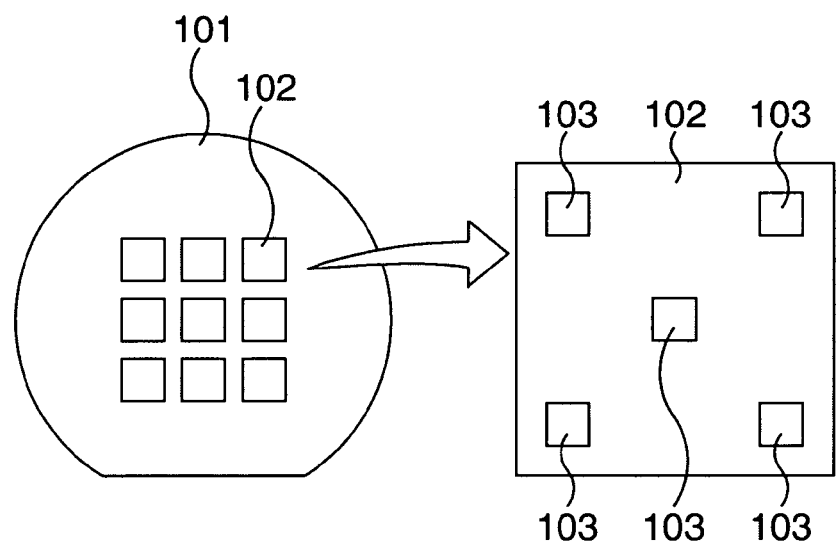
FIG. 1 is a view showing positions at which length measuring monitor regions are formed in a manufacturing method of a semiconductor device according to a first embodiment of the present invention.

A first embodiment of the present invention will be initially explained. FIG. 1 is a view showing positions at which the length measuring monitor regions are formed in the manufacturing method of the semiconductor device according to the first embodiment of the present invention. In the embodiment of the present invention, a plurality of chips 102 should be cut out of one wafer 101. Length measuring monitor regions 103 are provided at four corners and a center of each of the chips 102. Elements constituting an integrated circuit are formed at portions other than the length measuring monitor regions 103 in the chip 102. The length measuring monitor region 103 is, for example, a square or rectangular region with the length of one side of about 50 μm, for example.

Figure 2:
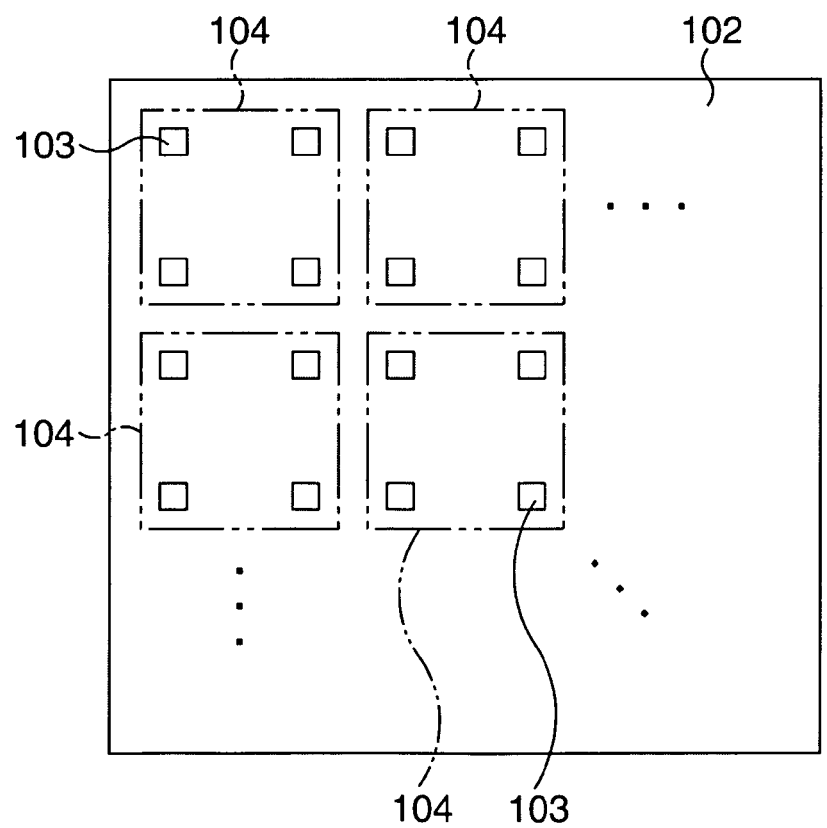
FIG. 2 is view showing an example in which a plurality of circuit blocks 104 are provided in a chip 102.

As shown in FIG. 2, a plurality of circuit blocks 104 may be provided in the chip 102. In this case, the length measuring monitor regions 103 may be provided at four corners of each of the circuit blocks 104, for example.

FIGS. 3A to 3G are sectional views showing the manufacturing method of the semiconductor device according to the first embodiment of the present invention in the sequence of process steps. FIGS. 4A to 4F are plan views showing the manufacturing method of the semiconductor device according to the first embodiment of the present invention in the sequence of process steps. FIGS. 3A to 3G show a region in which a MOS transistor constituting the integrated circuit is formed, and FIGS. 4A to 4F show the length measuring monitor region 103.

Figure 3A:
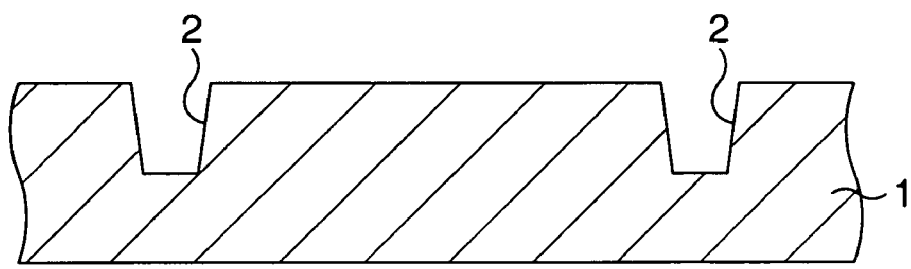
FIGS. 3A to 3G show sectional views showing the manufacturing method of the semiconductor device according to the first embodiment of the present invention in the sequence of process steps.

In the present embodiment, trenches 2 for element isolation are initially formed in a surface of a Si substrate 1 as shown in FIG. 3A. At this time, in the length measuring monitor region 103, the trench 2 is formed so that two L-shaped patterns 3a and 3b are symmetric with each other with respect to a point, a cross-shaped pattern 4a and a square pattern 5a are located in the vicinity of the L-shaped pattern 3a, which is one of the L-shaped patterns 3a and 3b, and a cross-shaped pattern 4b and a square pattern 5b are located in the vicinity of the L-shaped pattern 3b, which is the other one of the L-shaped patterns 3a and 3b. As for the sizes of the L-shaped patterns 3a and 3b, for example, the width is set at about 0.1 to 1 µm, and the length of each side is set at about 4 µm. As for the sizes of the cross-shaped patterns 4a and 4b, for example, the line width is set at about 0.2 to 0.5 µm, the length is set at about 1 to 2 µm. As for the sizes of the square patterns 5a and 5b, for example, the length of side is set at about 1 to 2 µm. The positions of the cross-shaped patterns 4a and 4b are set at positions where the center portions of the cross-shaped patterns 4a and 4b are respectively separated from bent portions of the L-shaped patterns 3a and 3b by about 1 µm in both the vertical direction and the horizontal direction, for example.

Figure 4A:
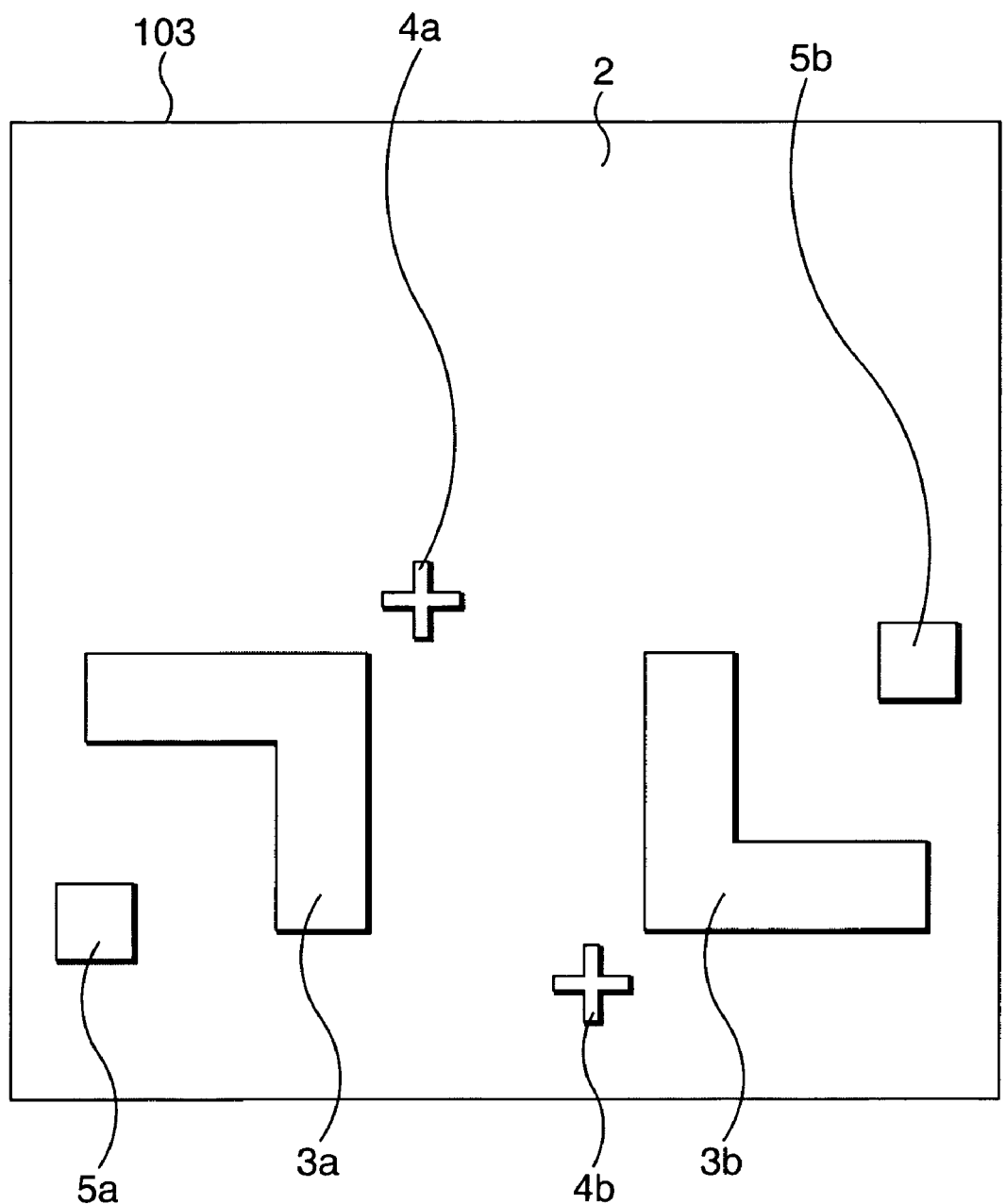
FIGS. 4A to 4F are plan views showing the manufacturing method of the semiconductor device according to the first embodiment of the present invention in the sequence of process steps.

In formation of the trench 2 for element isolation, a Si oxide film is formed by, for example, a thermal oxidation method, and thereafter, a Si nitride film is formed on the Si oxidation film by, for example, a CVD method. The thickness of the Si oxide film is made about 10 nm, for example, and the thickness of the Si nitride film is made about 112 µm, for example. Next, a resist pattern covering a region in which an active region is to be formed is formed, and the Si nitride film and the Si oxide film are etched with the resist pattern as a mask. Next, the resist pattern is removed by ashing. Thereafter, the Si substrate 1 is etched with the remaining Si nitride film as a mask. As a result, the trench 2 is formed. In FIGS. 3A and 4A, the Si oxide film and the Si nitride film are omitted.

In formation of the trench 2 for element isolation, the length measurement of the portions corresponding to the L-shaped patterns 3a and 3b are performed after the resist pattern is formed. In the length measurement, the focus is achieved in the portions (the first monitor pattern for alignment) corresponding to the cross-shaped patterns 4a and 4b of the respective resist patterns, and thereafter, with these portions as reference points, the positions of the portions corresponding to the L-shaped patterns 3a and 3b are determined. At this time, the shape of the portions corresponding to the cross-shaped patterns 4a and 4b are characteristic as compared with the shapes of the other portions, and therefore, it is easy to find out the positions in a short time. Accordingly, even if deformation and shrinkage of the portions corresponding to the cross-shaped patterns 4a and 4b occur, deformation and shrinkage of the portions corresponding to the L-shaped patterns 3a and 3b, which are the actual targets of measurement do not occur, and thus, the accurate values can be obtained.

Figure 3B:
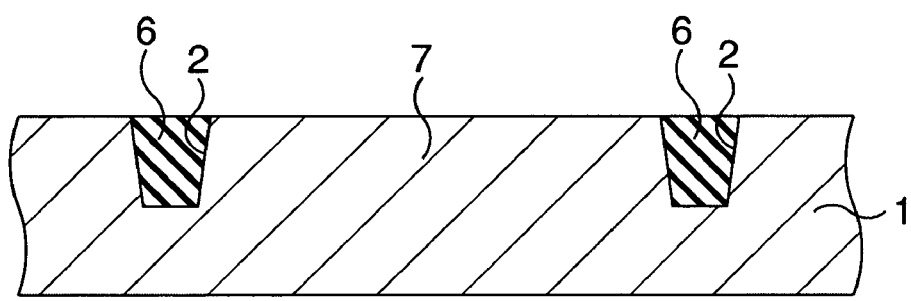
Figure 4B:
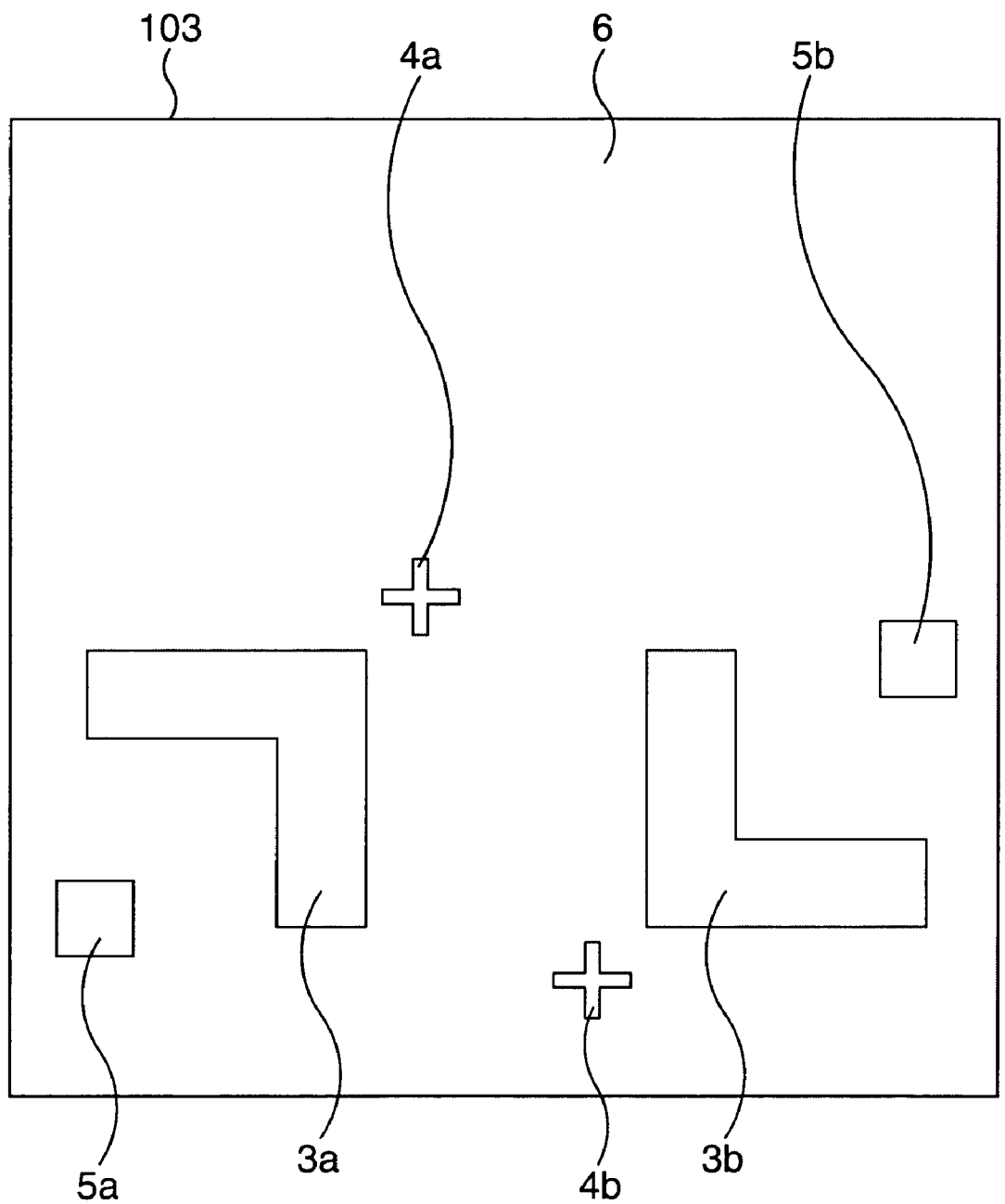

Subsequently, as shown in FIGS. 3B and 4B, an element isolation insulating film 6 is embedded in the trench 2, and thereby, an active region 7 is defined. Next, planarization is performed until a surface of the active region 7 is exposed by a CMP. Next, ion implantation for formation of a well and adjustment of a threshold value is properly performed.

Figure 3C:
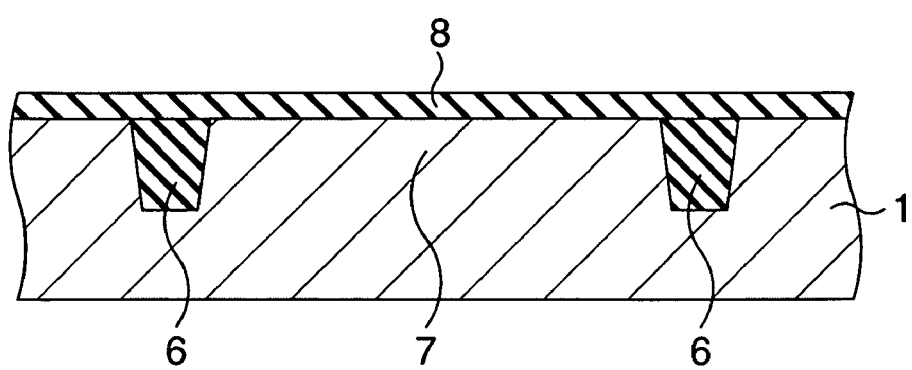
Figure 4C:
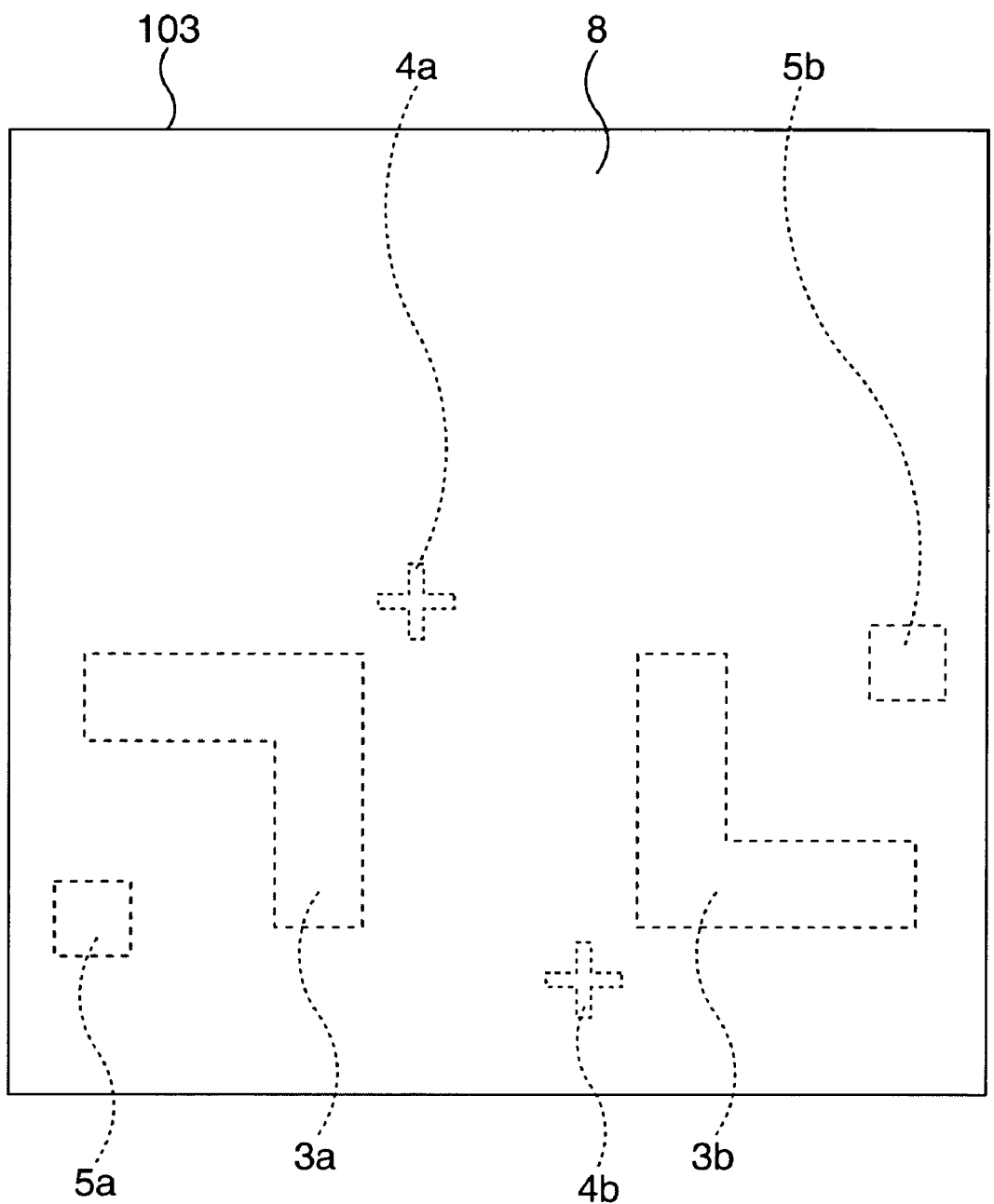

Thereafter, as shown in FIGS. 3C and 4C, a gate insulation film 8 constituted of, for example, a silicon oxyniride film is formed. The gate insulation film 8 may be formed, for example, by forming a Si oxide film by thermally oxidizing the surface of the active region and thereafter, nitriding the Si oxide film. The thickness of the gate insulation film 8 is made about 1 nm, for example.

Figure 3D:
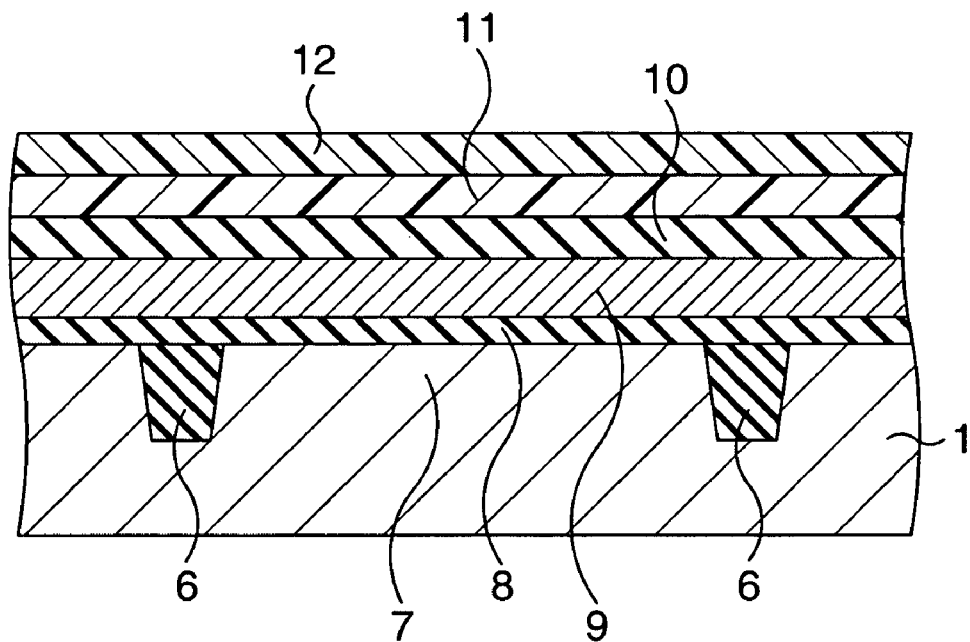
Figure 4D:
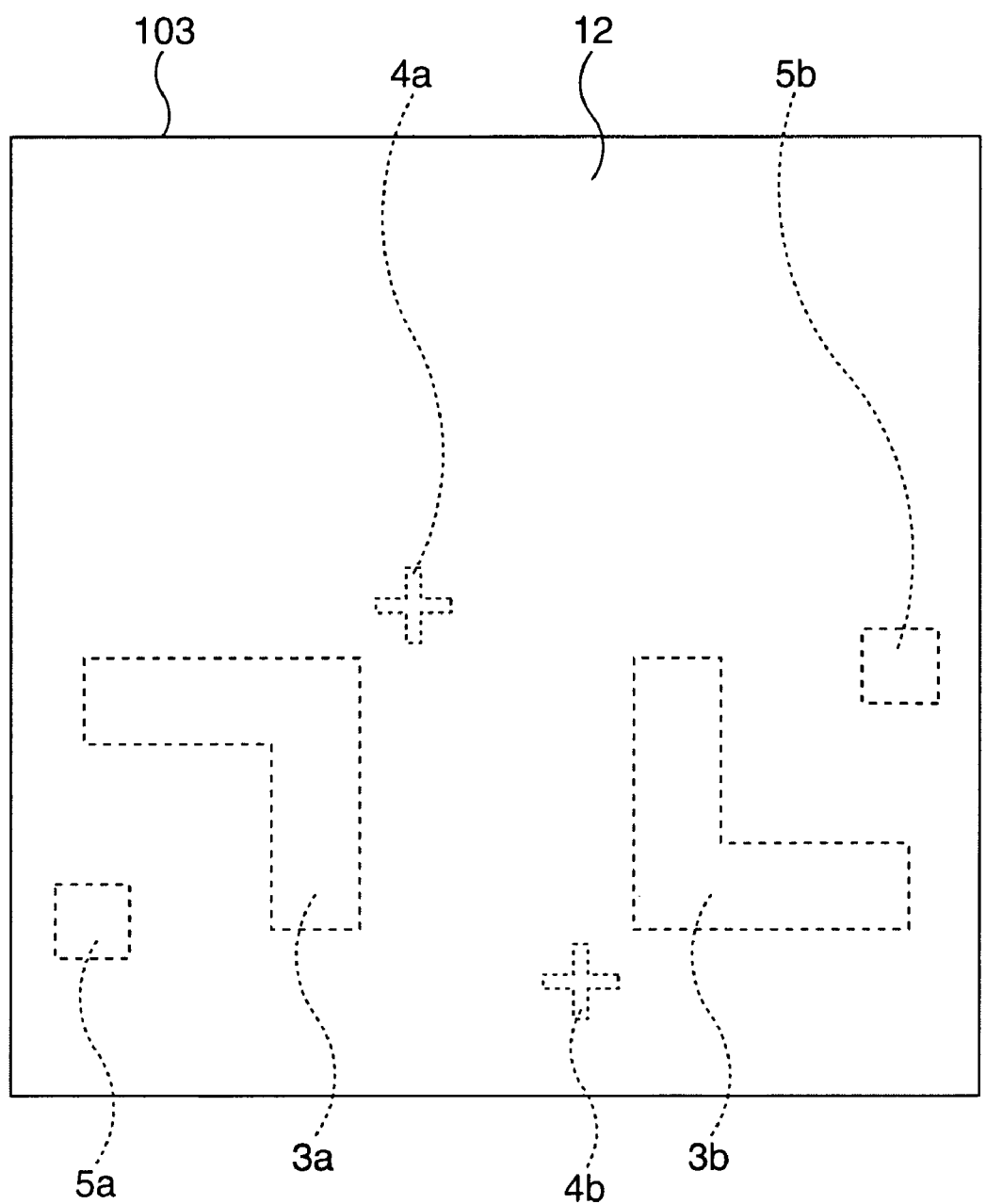

Subsequently, as shown in FIGS. 3D and 4D, a polysilicon film 9, a hard mask film 10, an antireflection film 11 and a resist film 12 are formed on the gate insulation film 8 in sequence. The polysilicon film 9 is formed by a CVD method, for example, and its thickness is made about 110 nm. As the hard mask film 10, a Si oxide film of thickness of about 30 nm is formed by a CVD method using TEOS (tetraethylorthosilicate), for example. As the antireflection film 11, an organic film which absorbs light of a wavelength band of ArF excimer laser, for example, is formed by a spin coat method, and its thickness is made about 82 nm. As the resist film 12, a film which sensitizes to the ArF excimer laser, for example, is formed, and its thickness is made about 300 nm.

Figure 3E:
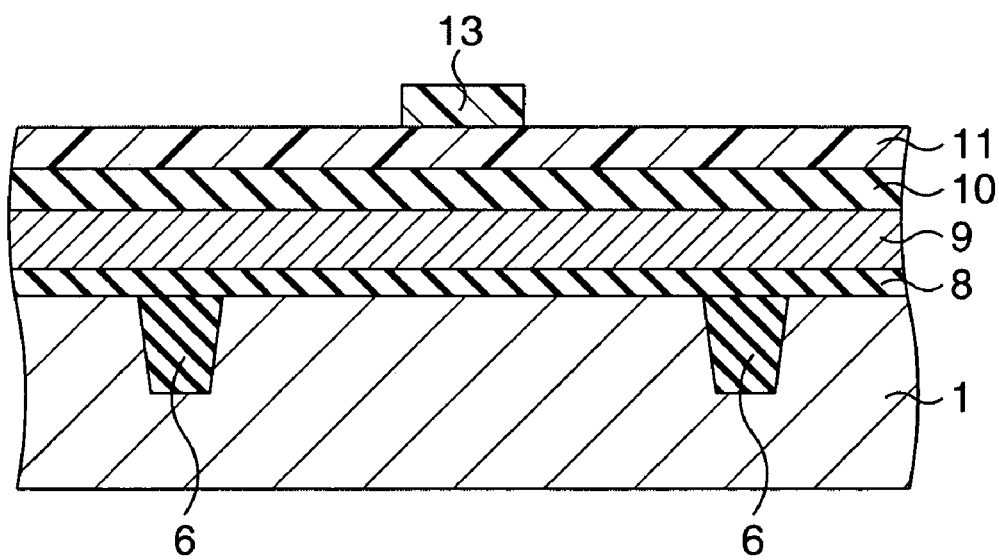
Figure 3F:
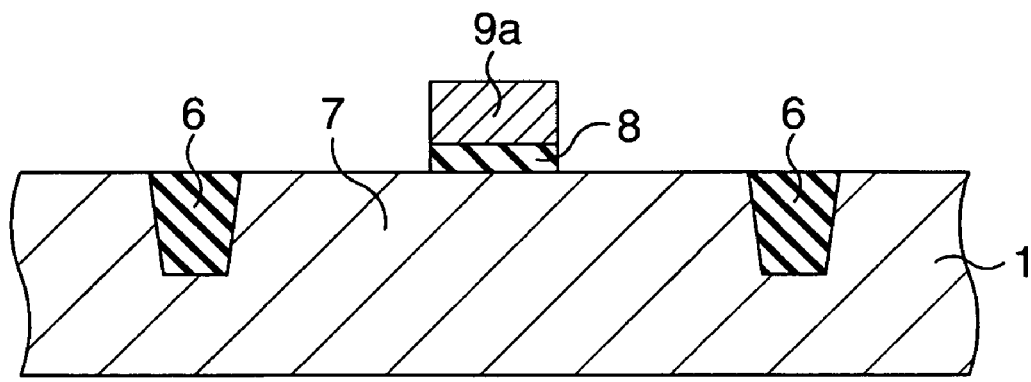
Figure 4E:
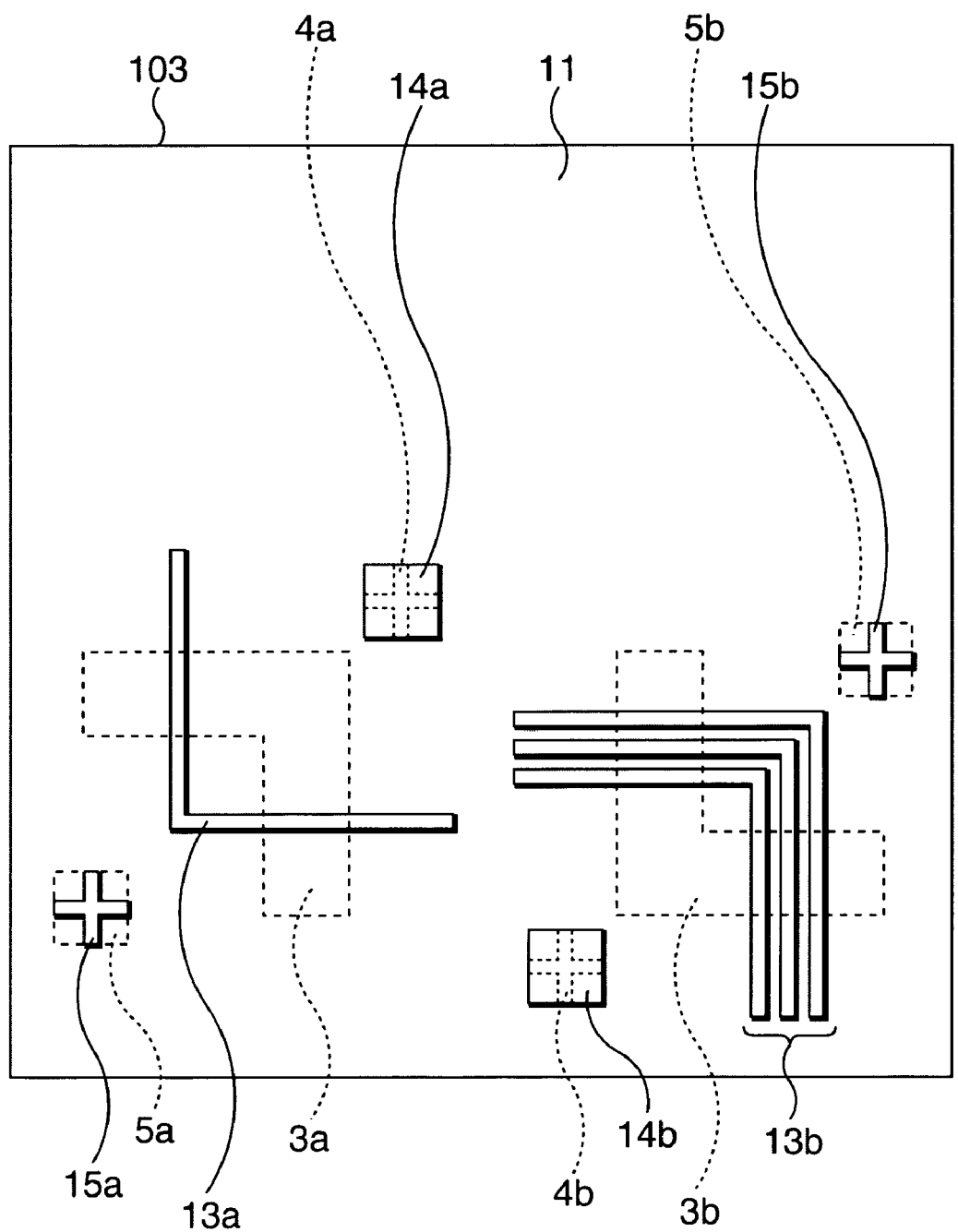
Figure 4F:
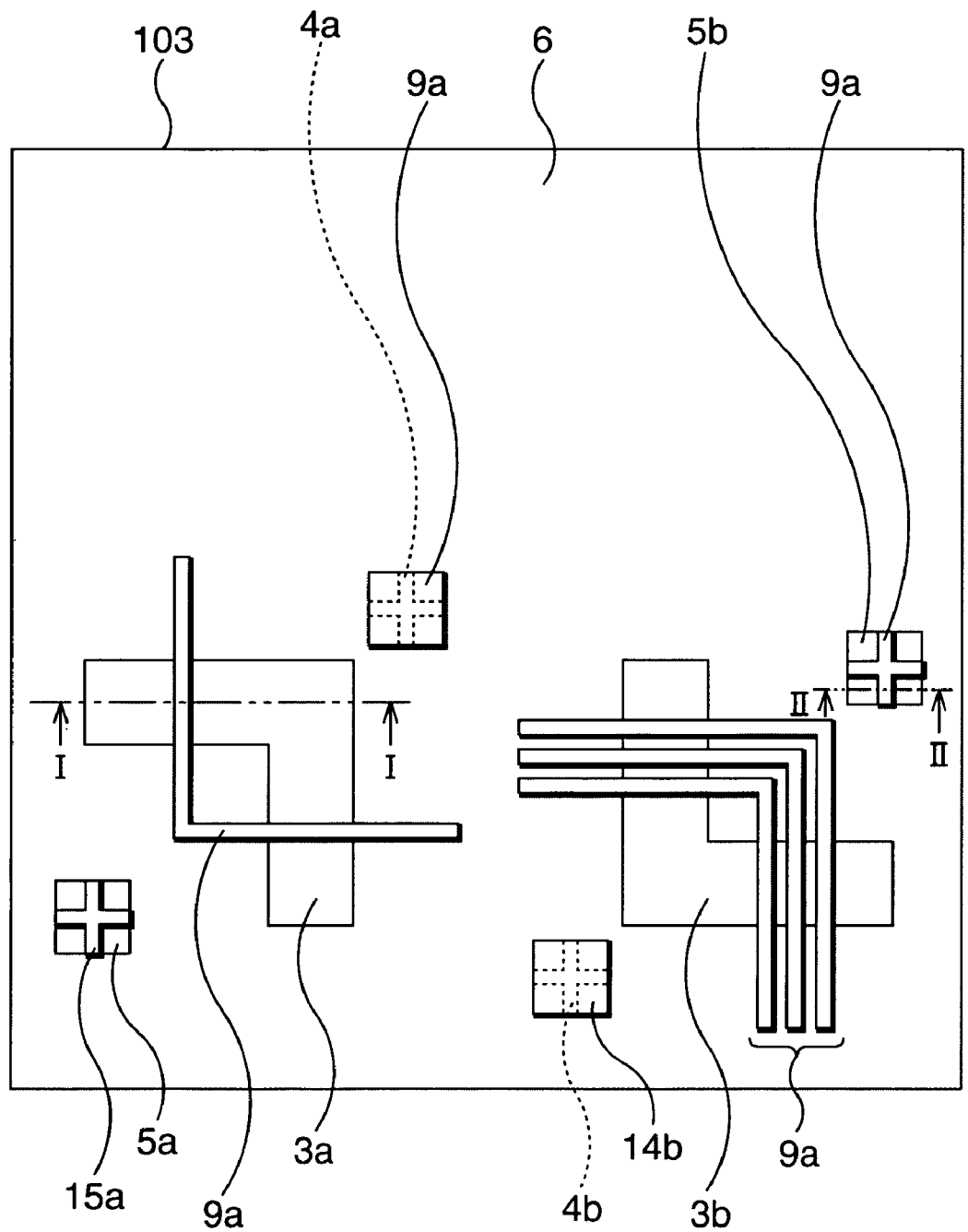
Figure 5A:
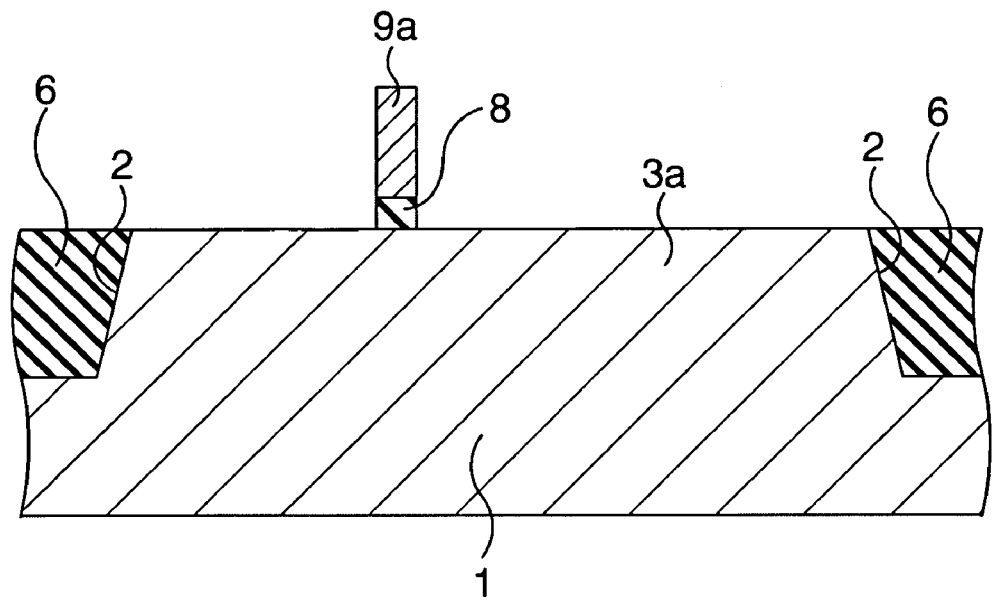
FIG. 5A is a sectional view taken along the line I-I in FIG. 4F.
Figure 5B:
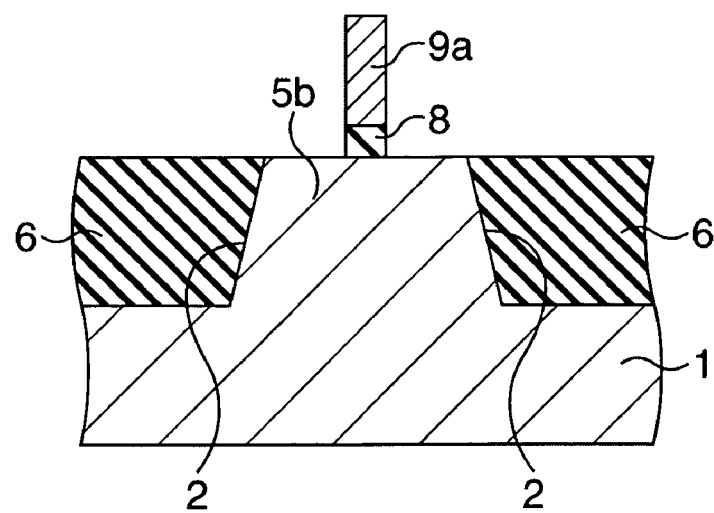
FIG. 5B is a sectional view taken along the line II-II in FIG. 4F.
Figure 6A:
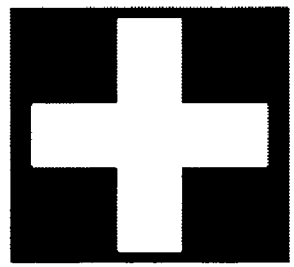
FIGS. 6A to 6F are views showing plane shapes of various monitor patterns for alignment.
Figure 6B:
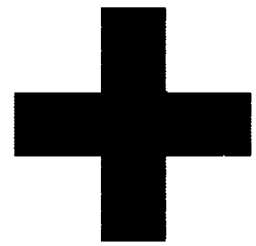
Figure 6C:
Figure 6D:
Figure 6E:
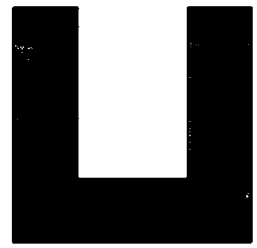
Figure 6F:
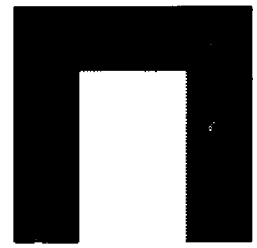

Next, exposure and development are performed for the resist film 12, and thereby, a gate pattern 13 for a gate electrode is formed as shown in FIG. 3E. At this time, an L-shaped isolated pattern 13a intersecting the L-shaped pattern 3a in the plane view, a line and space (L/S) pattern 13b with a plurality of L-shaped lines and spaces (L/S) intersecting the L-shaped pattern 3b in the plane view, a square pattern 14a overlaid on the cross-shaped pattern 4a in the plane view, a cross-shaped pattern 15a overlaid on the square pattern 5a in the plane view, a square pattern 14b overlaid on the cross-shaped pattern 4b in the plane view, and a cross-shaped pattern 15b overlaid on the square pattern 5b in the plane view are formed in the length measuring monitor region 103 as shown in FIG. 4E, for example. Namely, the orientations of the L-shaped patterns 13a and 13b are respectively made to correspond to the orientations of the L-shaped patterns 3a and 3b when rotated 180 degrees in the plane view. As for the sizes of the isolated pattern 13a and the L/S pattern 13b, for example, the width is made about 80 nm and the length of each side is made about 4 µm at the longest. As for the sizes of the square patterns 14a and 14b, for example, the length of each side is made about 1 to 2 µm. The positions of the cross-shaped patterns 15a and 15b are set at the positions at which the center portions of the cross-shaped patterns 15a and 15b are respectively separated from bent portions of the patterns 13a and 13b by about 1 µm in both the vertical direction and the horizontal direction, for example.

After the patterns 13, 13a, 13b, 14a, 14b, 15a and 15b are formed, the length measurement of the patterns 13a and 13b are performed. In this length measurement, the focuses are achieved in the cross-shaped patterns 15a and 15b, which are respectively the second monitor patterns for alignment, and thereafter, the positions of the patterns 13a and 13b are determined with these focuses as the reference points. At this time, the shapes of the cross-shaped patterns 15a and 15b are characteristic as compared with the shapes of the other portions, and therefore, it is easy to find out the positions of them in a short time. Accordingly, even if deformation and shrinkage occur to the cross-shaped patterns 15a and 15b, deformation and shrinkage of the portions corresponding to the patterns 13a and 13b, which are the actual measurement targets, do not occur and the accurate values can be obtained.

Next, as shown in FIGS. 3F and 4F, and FIGS. 5A and 5B, the antireflection film 11, the hard mask film 10 and the polysilicon film 9 are etched with the resist patterns 13, 13a, 13b, 14a, 14b, 15a and 15b as a mask, and thereafter, the resist patterns 13, 13a, 13b, 14a, 14b, 15a and 15b, the antireflection film 11 and the hard mask film 10 are removed by ashing and wet treatment.

However, after etching of the polysilicon film is performed, the length measurement of the patterns 13a and 13b are performed as described above. By performing the length measurement, the trimming amount of the patterns 13a and 13b, which occur on the occasion of forming the gate electrode 9a, can be grasped. Namely, the width of the patterns 13a and 13b is made narrow by etching, and how large the amount of trimming is can be grasped.

Figure 3G:
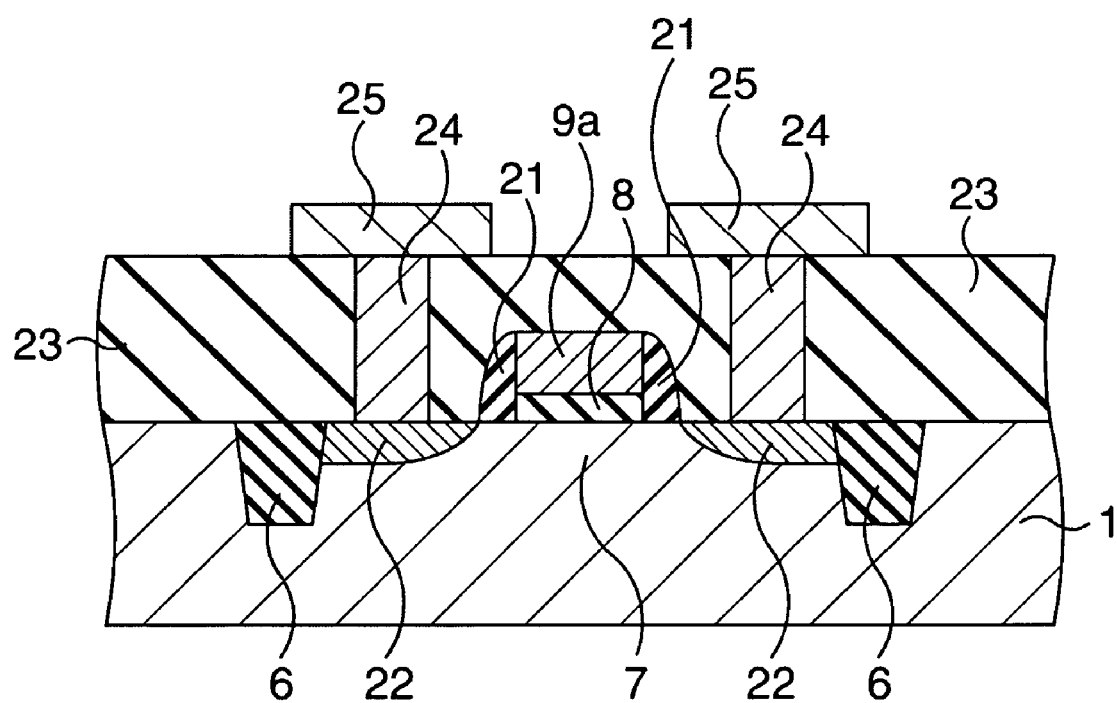

Subsequently, as shown in FIG. 3G, side walls 21, source drain diffusion layers 22, interlayer insulation films 23, contact plugs 24 and wirings 25 are formed. Then, by further forming wirings (not shown) and the like of upper layers, the semiconductor device is completed.

According to the above first embodiment, the actual measurement targets can be found out easily in a short time after the focuses are achieved as described above, and therefore, length measurement can be performed in the state in which deformation and shrinkage of the resist patterns do not occur. Accordingly, the accurate values can be obtained.

Since the plane shape of the patterns which are the length measurement targets are made L-shapes, it is possible to perform length measurement concerning two directions orthogonal to each other by using one pattern.

Further, if the cross-shaped patterns 4a and 4b are exposed on the occasion of performing length measurement of the patterns 13a and 13b, there is the fear of occurrence of erroneous recognition of the positions, but in this embodiment, the cross-shaped patterns 4a and 4b are covered with the square patterns 14a and 14b, and therefore, such erroneous recognition can be avoided. Further, since the cross-shaped patterns 15a and 15b are formed to be overlaid on the square patterns 5a and 5b in the plane view, the contrast of the cross-shaped patterns 15a and 15b become high, and the pattern edges thereof can be easily detected. Therefore, high recognition degree of patterns can be obtained.

The plane shape of the monitor pattern for alignment does not need to be a cross shape, but any shape may be adopted if only the difference from the rectangular shape is clear. For example, six kinds of shapes may be cited as shown in FIGS. 6A to 6F. A straight-line pattern may be formed instead of the L-shaped pattern. In this case, if the length measurement in two directions orthogonal to each other is needed, it is suitable to form two kinds of straight-line patterns which extend in the orthogonal directions to each other.

Second Embodiment

Figure 7A:
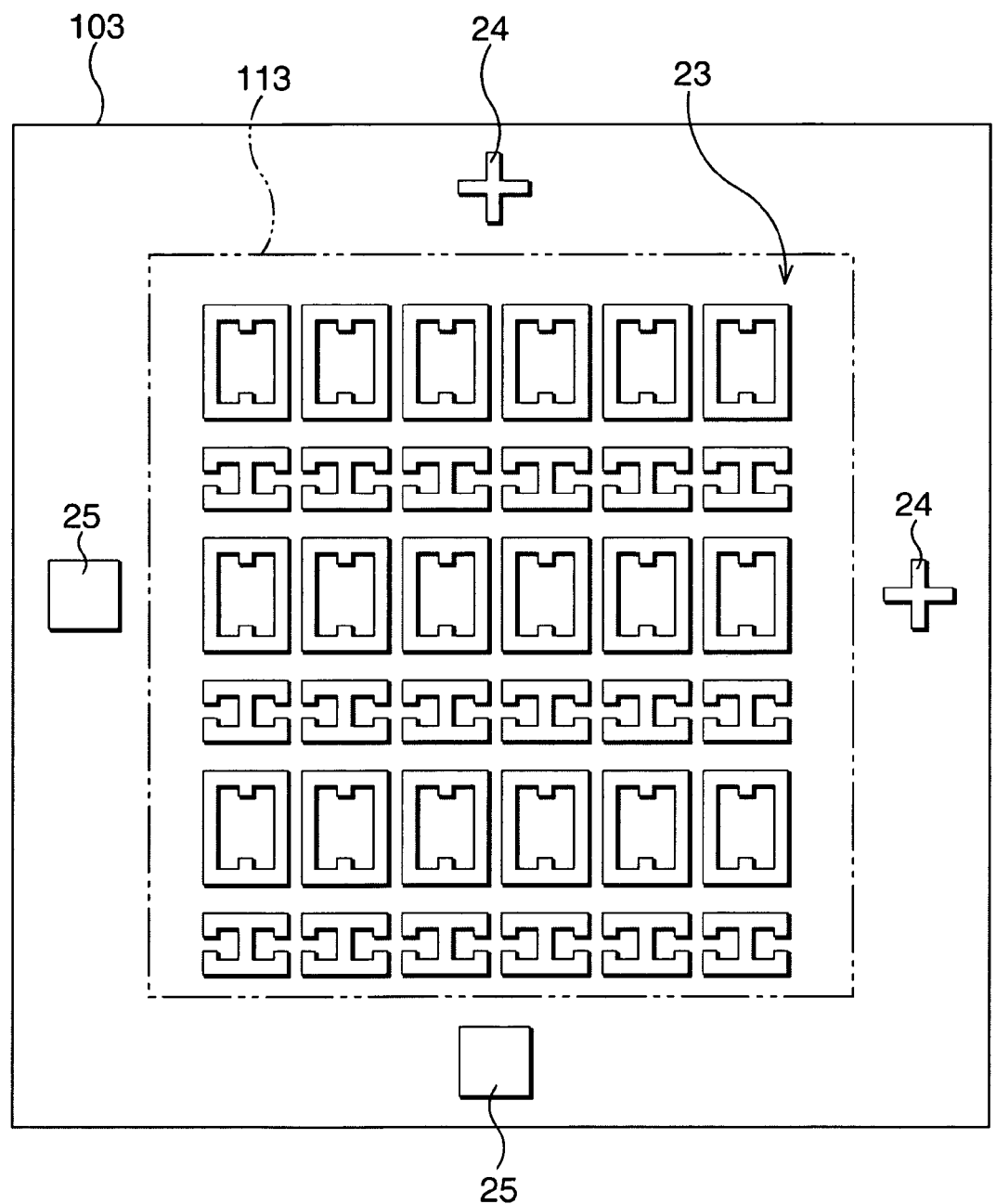
FIGS. 7A and 7B are plane views showing a manufacturing method of a semiconductor device according to a second embodiment of the present invention in the sequence of process steps.
Figure 7B:
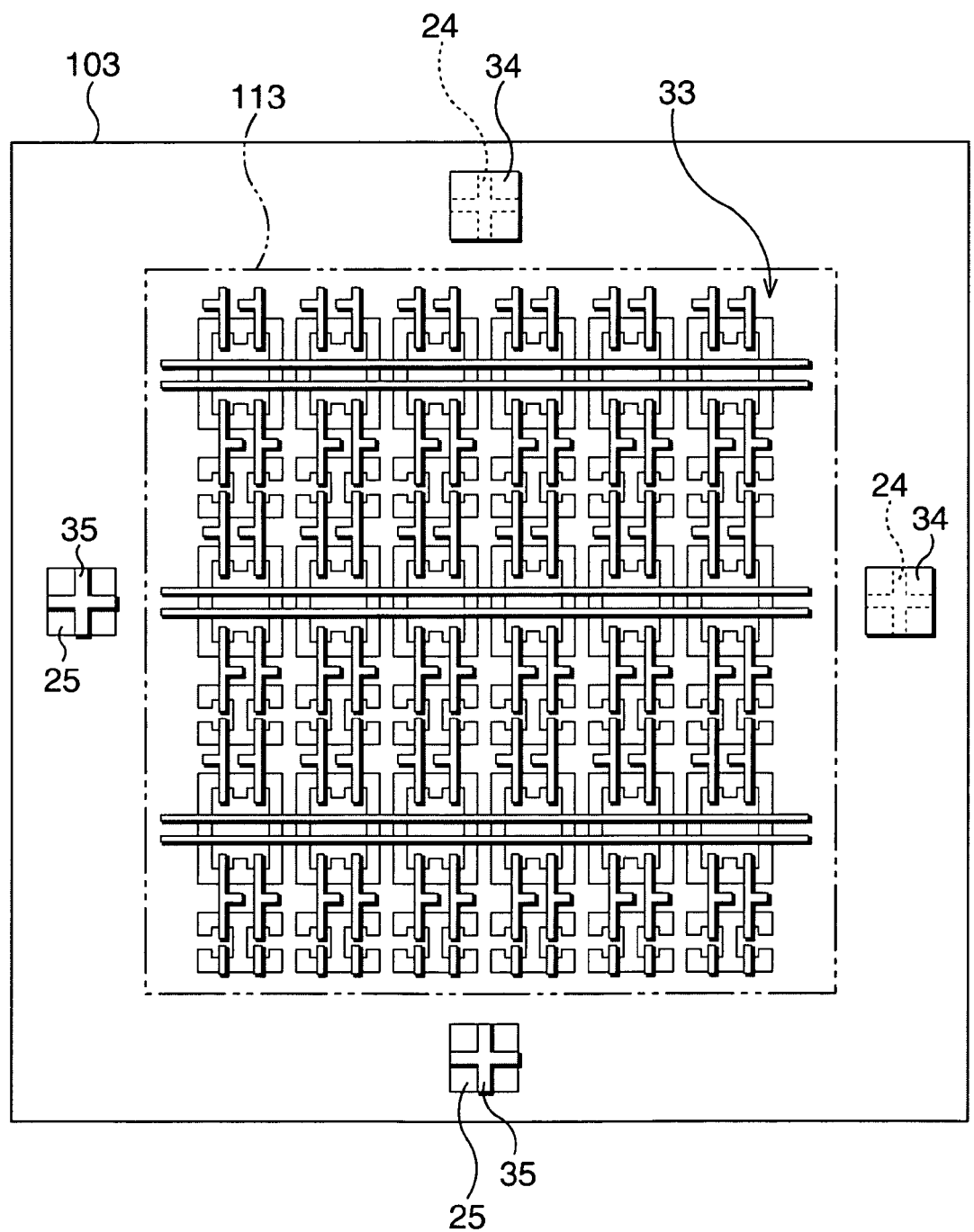
Figure 8A:
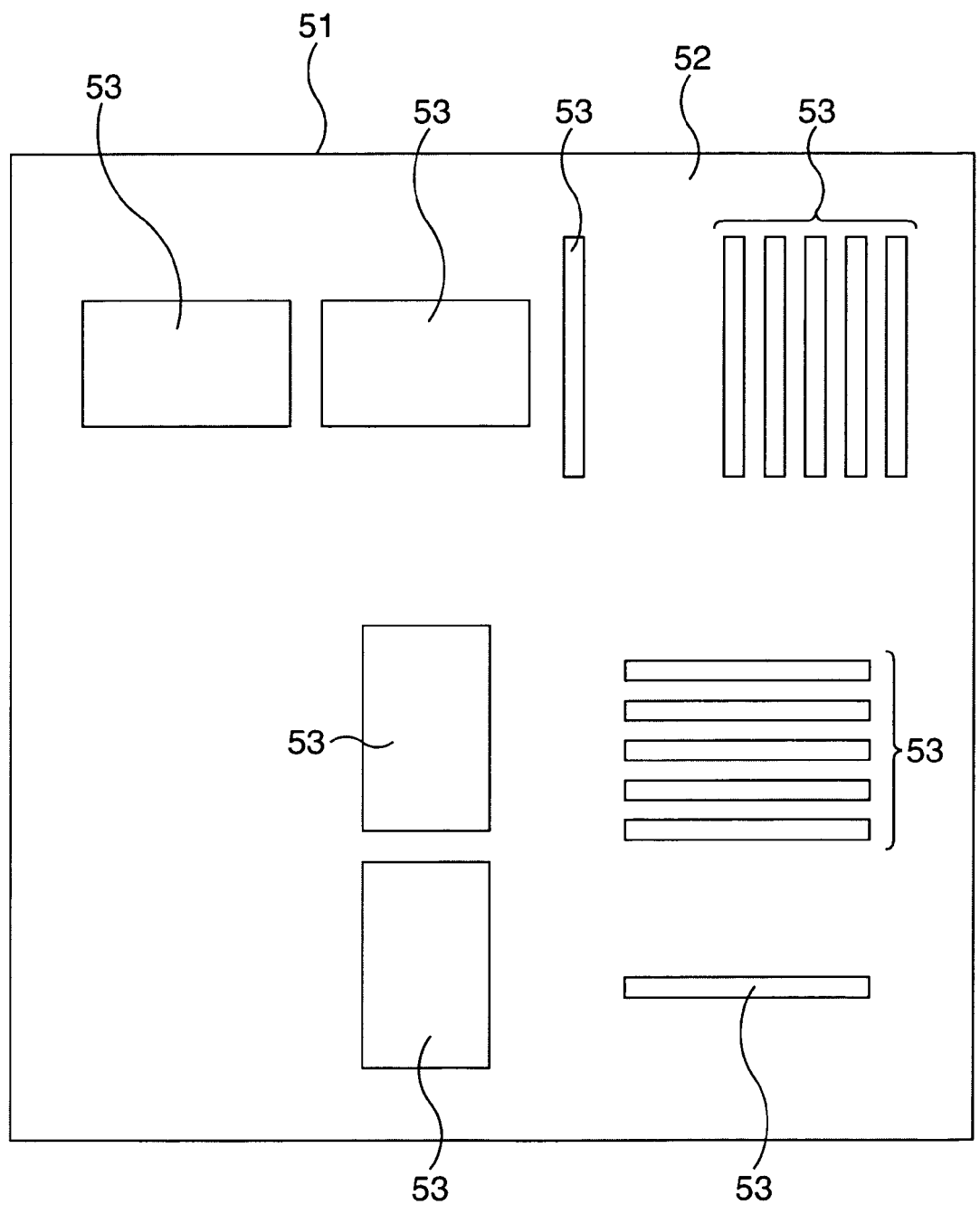
FIGS. 8A and 8B are plane views showing a conventional manufacturing method of a semiconductor device in the sequence of process steps.
Figure 8B:
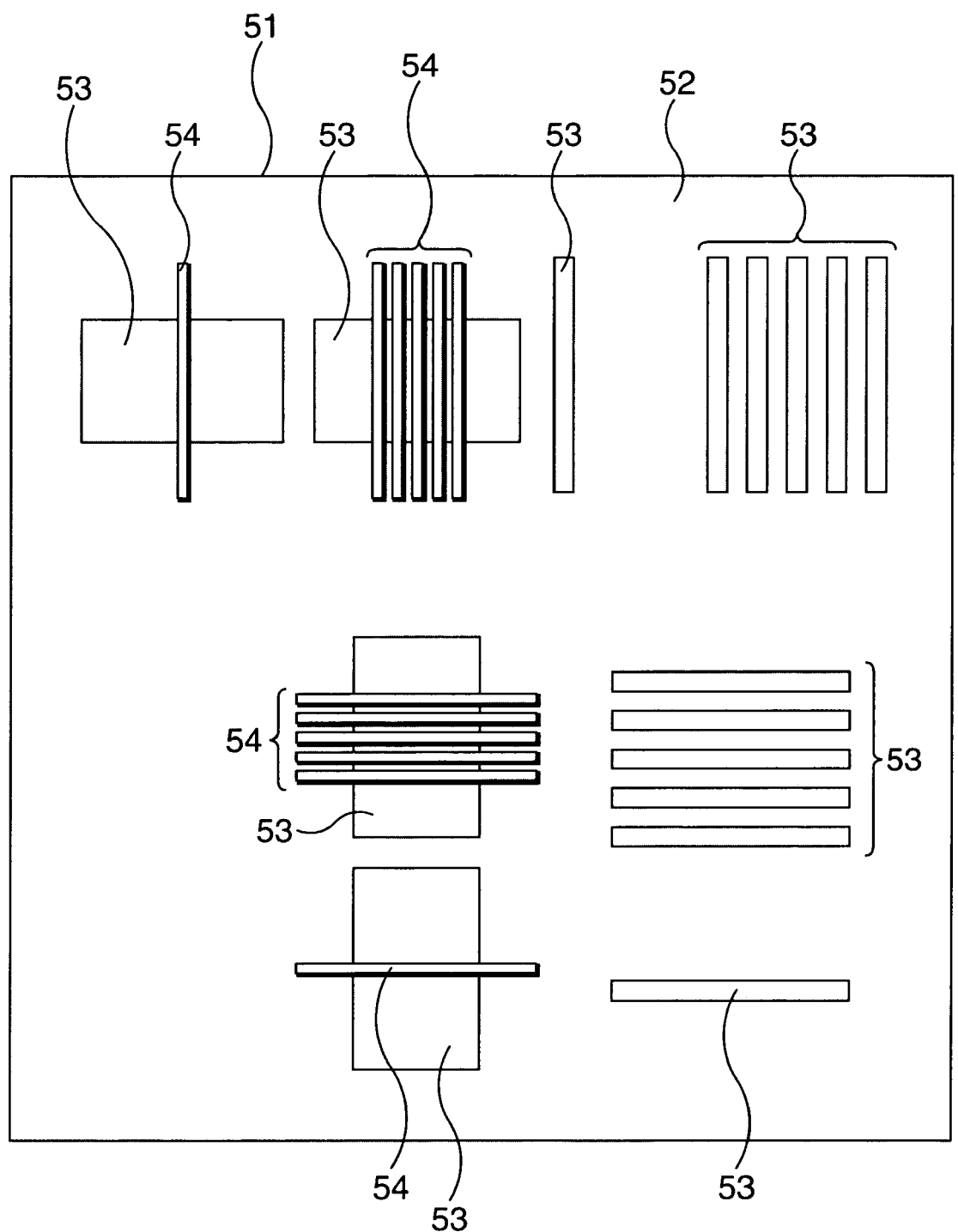
Figure 9A:
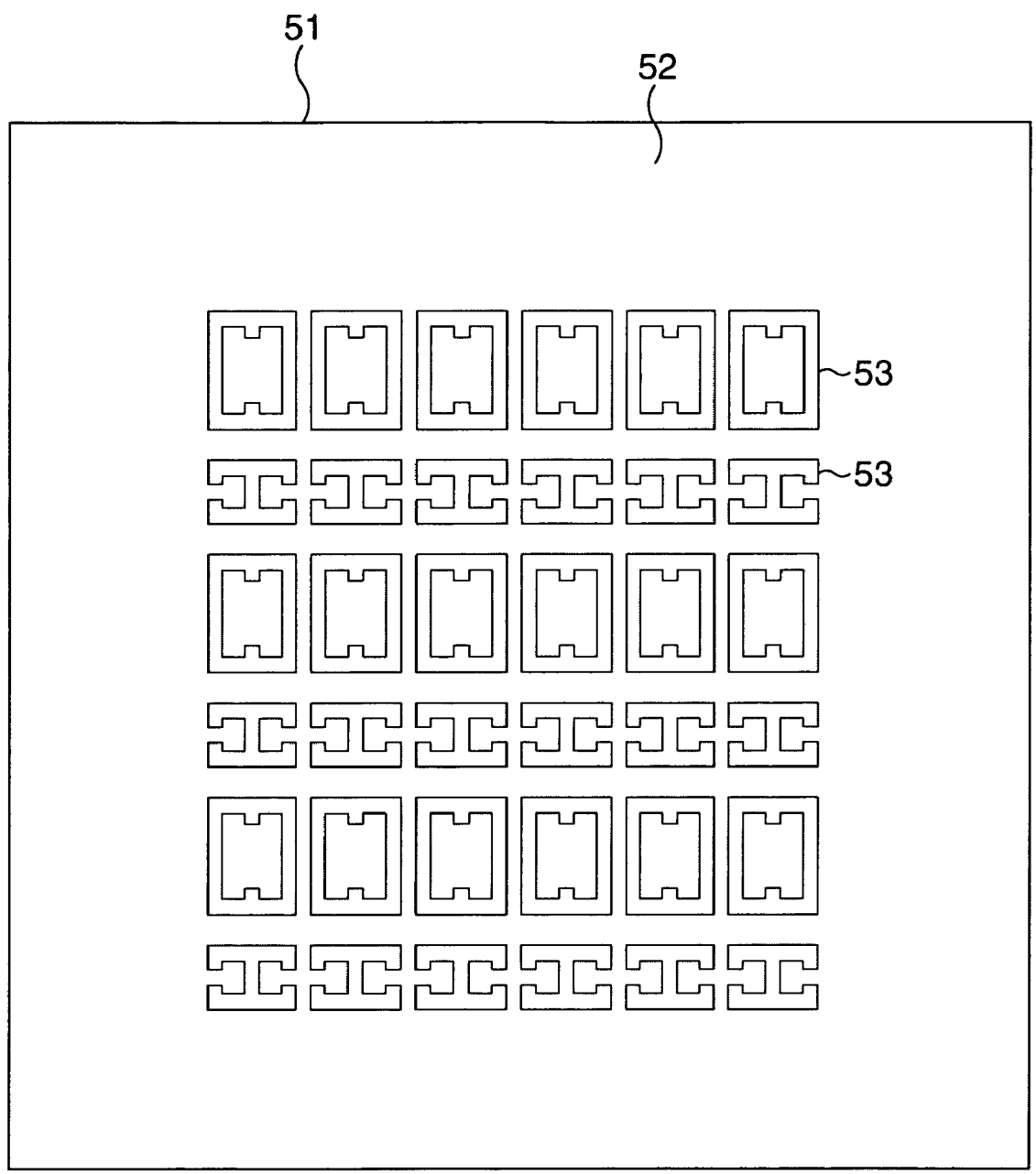
FIGS. 9A and 9B are plane views showing a conventional manufacturing method of a semiconductor device including repetitive patterns.
Figure 9B:
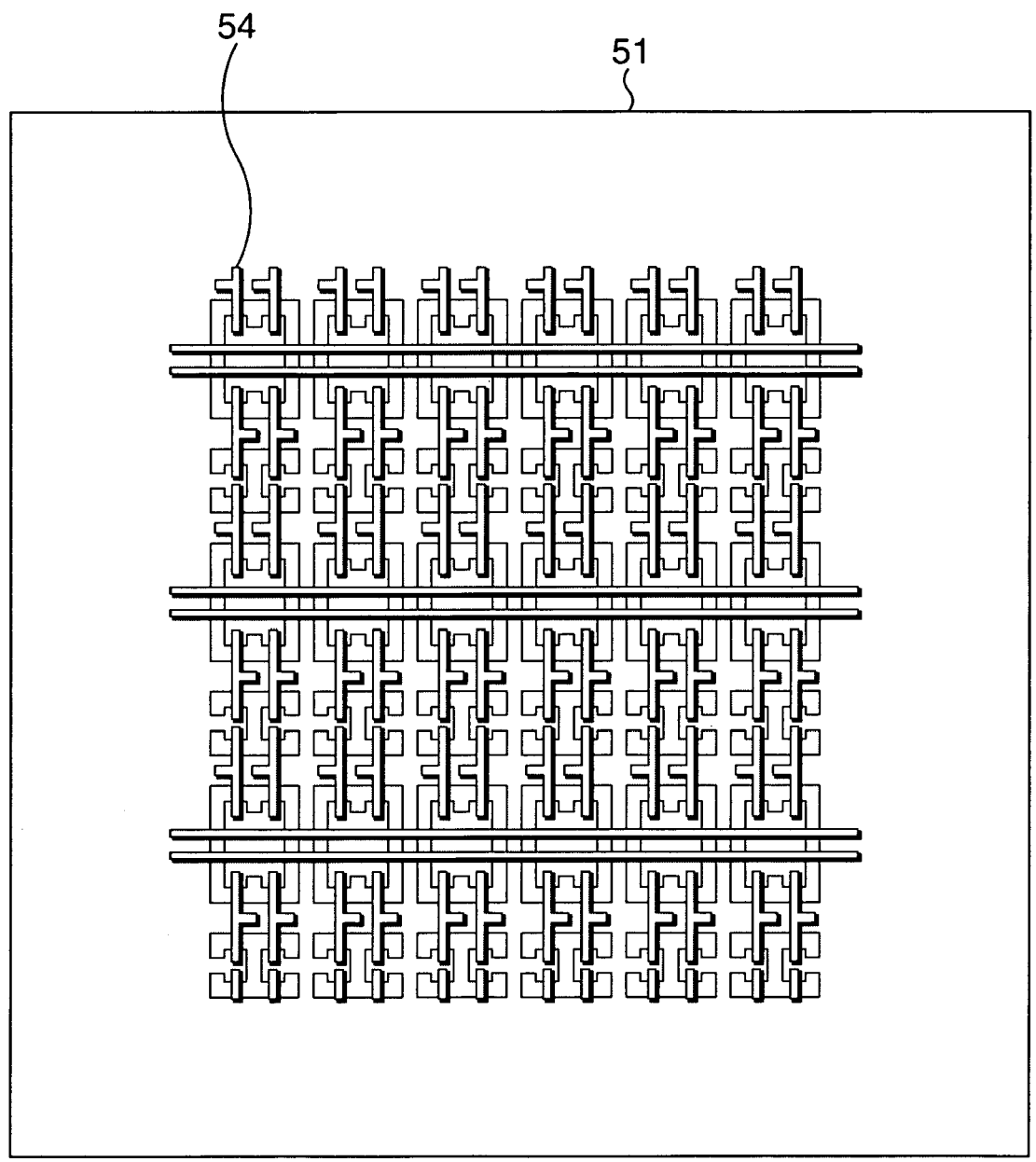

Next, a second embodiment of the present invention will be explained. In the second embodiment, a semiconductor device including a repetitive pattern such as a SRAM cell is manufactured. FIGS. 7A and 7B are plane views showing a manufacturing method of a semiconductor device according to the second embodiment of the present invention.

In the present embodiment, a repetitive pattern 23 is formed in a square region 113 with length of each side of about 10 µm, for example, as shown in FIG. 7A in parallel with formation of the trenches 2 for element isolation, namely, defining of the active region. As in the first embodiment, cross-shaped patterns 24 and square patterns 25 are formed in the vicinity of the region 113, for example, within 10 µm from an edge of the region 113. These patterns 23, 24 and 25 are formed inside the length measuring monitor region 103.

Thereafter, a repetitive pattern 33 is formed in the region 113, as shown in FIG. 7B, in parallel with formation of word lines of a SRAM cell. Square patterns 34 and cross-shaped patterns 35 are formed to be respectively overlaid on the cross-shaped patterns 24 and the square patterns 25 in the plane view.

In the above-described second embodiment, both at the time of formation of the active region and at the time of formation of the word lines, the repetitive patterns and the cross patterns are formed inside the length measuring monitor region 103, and therefore, the length measurement of the portions corresponding to the repetitive patterns in the resist pattern can be performed accurately as in the first embodiment.

According to the present invention, the monitor pattern for alignment can be easily detected, and therefore, with that as a reference, the position of the length measuring pattern can be accurately determined. Accordingly, even if the target of the length measurement is the one made of a material vulnerable to an electron beam as an ArF chemically amplified resist, length measurement can be performed with high accuracy before deformation or the like occurs.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a semiconductor device, comprising:
    forming a resist film on an object to be worked;
    forming a circuit pattern for a semiconductor integrated circuit, a length measuring pattern and a monitor pattern for alignment on the resist film; and
    patterning the object with the circuit pattern, the length measuring pattern and the monitor pattern as a mask,
    wherein a plane shape of the monitor pattern is a polygonal shape, that is not quadrangular and whose side lengths are 2 µm or less.

2. The manufacturing method of a semiconductor device according to claim 1, further comprising:
    finding out a position of the length measuring pattern based on positional relationship with the monitor pattern as a reference; and
    performing length measurement of the length measuring pattern, before said step of patterning the object.

3. The manufacturing method of a semiconductor device according to claim 1, wherein the plane shape of the monitor pattern is a cross-shape or a U-shape.

4. The manufacturing method of a semiconductor device according to claim 1, wherein the plane shape of the length measuring pattern is an L-shape.

5. The manufacturing method of a semiconductor device according to claim 4, wherein the length measuring pattern includes two or more patterns that are symmetric with respect to a line or symmetric with respect to a point.

6. The manufacturing method of a semiconductor device according to claim 1, wherein the length measuring pattern includes at least an isolated pattern.

7. The manufacturing method of a semiconductor device according to claim 1, wherein the length measuring pattern includes at least a line and space pattern.

8. The manufacturing method of a semiconductor device according to claim 1, wherein repetitive patterns are respectively included in the circuit pattern and in the length measuring pattern.

9. A manufacturing method of a semiconductor device, comprising:
    forming a first resist film on a first object to be worked;
    forming a first circuit pattern for a semiconductor integrated circuit, a first L-shaped length measuring pattern and a first monitor pattern for alignment on the first resist film;
    patterning the first object based on the first circuit pattern, the first L-shaped length measuring pattern and the first monitor pattern;

forming a second object to be worked on or above the first object;

forming a second resist film on the second object;

forming a second circuit pattern for a semiconductor integrated circuit, a second L-shaped length measuring pattern and a second monitor pattern for alignment on the second resist film so that the second L-shaped length measuring pattern faces in a direction in which the first L-shaped length measuring pattern is rotated 180 degrees in plane view; and patterning the second object with the second circuit pattern, the second L-shaped length measuring pattern and the second alignment monitor pattern as a mask, wherein plane shapes of the first and second monitor patterns are polygonal shapes, that are not quadrangular and whose side lengths are 2 μm or less.

10. The manufacturing method of a semiconductor device according to claim 9, further comprising:

finding out a position of the first length measuring pattern based on a positional relationship with the first monitor pattern as a reference;

performing length measurement of the first length measuring pattern, before said step of patterning the first object;

finding out a position of the second length measuring pattern based on a positional relationship with the second monitor pattern as a reference; and performing length measurement of the second length measuring pattern, before said step of patterning the second object.

11. The manufacturing method of a semiconductor device according to claim 9, wherein the plane shapes of the first and second monitor patterns are cross-shapes or U-shapes.

12. The manufacturing method of a semiconductor device according to claim 9, wherein the first and second length measuring patterns each include two or more patterns that are symmetric with respect to a line or symmetric with respect to a point.

13. The manufacturing method of a semiconductor device according to claim 9, wherein the first and second length measuring patterns each include at least an isolated pattern.

14. The manufacturing method of a semiconductor device according to claim 9, wherein the first and second length measuring patterns each include at least a line and space pattern.

15. The manufacturing method of a semiconductor device according to claim 9, wherein the second length measuring pattern is overlaid on the first length measuring pattern in plane view.

16. The manufacturing method of a semiconductor device according to claim 9, wherein said step of forming the second circuit pattern, the second L-shaped length measuring pattern and the second monitor pattern includes forming a second rectangular pattern overlaid on the first monitor pattern in plane view, on the second resist film.

17. The manufacturing method of a semiconductor device according to claim 9, wherein said step of forming the first circuit pattern, the first L-shaped length measuring pattern and the first monitor pattern includes forming a first rectangular pattern on the first resist film, and the second monitor pattern is overlaid on the first rectangular pattern in plane view.

18. The manufacturing method of a semiconductor device according to claim 9, wherein repetitive patterns are respectively included in the first circuit pattern, the first length measuring pattern, the second circuit pattern and the second length measuring pattern.

19. A semiconductor device, comprising the pattern formed according to the method according to claim 9.

20. A semiconductor substrate, comprising the pattern formed according to the method according to claim 9.

* * * * *